United States Patent
Fiolka et al.

(10) Patent No.: US 8,319,945 B2
(45) Date of Patent: Nov. 27, 2012

(54) ILLUMINATION SYSTEM OF A MICROLITHOGRAPHIC PROJECTION EXPOSURE APPARATUS

(75) Inventors: Damian Fiolka, Oberkochen (DE); Vladan Blahnik, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 420 days.

(21) Appl. No.: 12/779,133

(22) Filed: May 13, 2010

(65) Prior Publication Data

US 2010/0231887 A1    Sep. 16, 2010

Related U.S. Application Data

(63) Continuation of application No. PCT/EP2008/065462, filed on Nov. 13, 2008.

(30) Foreign Application Priority Data

Nov. 16, 2007 (DE) .......................... 10 2007 055 063

(51) Int. Cl.
  G03B 27/72 (2006.01)
  G03B 27/54 (2006.01)
(52) U.S. Cl. .......................................... 355/71; 355/67
(58) Field of Classification Search ............. 355/71, 355/67, 53
  See application file for complete search history.

(56) References Cited

U.S. PATENT DOCUMENTS

| | | | |
|---|---|---|---|
| 4,895,447 A * | 1/1990 | Jarisch et al. | 356/509 |
| 6,535,273 B1 | 3/2003 | Maul | |
| 2003/0086156 A1 | 5/2003 | McGuire, Jr. | |
| 2004/0169924 A1 | 9/2004 | Flagello et al. | |
| 2005/0007573 A1 | 1/2005 | Hansen et al. | |
| 2005/0094268 A1 | 5/2005 | Fiolka et al. | |
| 2008/0055580 A1 | 3/2008 | Fiolka | |

FOREIGN PATENT DOCUMENTS

| | | |
|---|---|---|
| DE | 198 29 612 | 1/2000 |
| DE | 10 2008 013 567 | 11/2008 |
| WO | WO 2003/077011 | 9/2003 |
| WO | WO 2006/131517 | 12/2006 |

OTHER PUBLICATIONS

Piscani et al., "Demonstration of sub-45nm features using azimuthal polarization on a 1.30NA immersion microsteeper," Proc. SPIE, vol. 6520, p. 25-1 to 25-10 (Mar. 2007).
Van Setten et al., "Pushing the boundary: low-k1 extension by polarized illumination," Proc. SPIE, vol. 6520, p. 0C-1 to 0C-12 (Mar. 2007).
de Boeji et al., "Enabling the 45nm node by hyper-NA polarized lithography," Proc. SPIE, vol. 6154, p. 0B-1 to 0B-11 (2006).
Jasper et al , "Immersion lithography with an ultrahigh-NA in-line catadioptric lens and a high-transmission flexible polarization illumination system," Proc. SPIE, vol. 6154, p. 1W-1 to 1W-14 (2006).
International Preliminary Report for Patentability for PCT Application No. PCT/EP2008/065462 mailed May 27, 2010.

* cited by examiner

Primary Examiner — Peter B Kim
(74) Attorney, Agent, or Firm — Fish & Richardson P.C.

(57) ABSTRACT

A microlithographic projection exposure apparatus includes an illumination system and a projection objective. During use of the microlithographic projection exposure apparatus, the illumination system illuminates an object plane of the projection objective. The illumination system is configured so that light components in point-symmetrical relationship with each other, which are produced during use of the illumination system and which are only superposed in the object plane, have mutually orthogonal polarization states.

20 Claims, 7 Drawing Sheets

ILLUMINATION SYSTEM OF A MICROLITHOGRAPHIC PROJECTION EXPOSURE APPARATUS

CROSS-REFERENCE TO RELATED APPLICATIONS

This application is a continuation of, and claims benefit under 35 USC 120 to, international application PCT/EP2008/065462, filed Nov. 13, 2008, which claims benefit of German Application No. 10 2007 055 063.6, filed Nov. 16, 2007. International application PCT/EP2008/065462 is hereby incorporated by reference in its entirety.

FIELD

The application relates to an illumination system of a microlithographic projection exposure apparatus.

BACKGROUND

Microlithography is used for the production of microstructured components, such as, for example, integrated circuits or LCDs. The microlithography process is carried out in what is referred to as a projection exposure apparatus having an illumination system and a projection objective. An image of a mask (=reticle) is illuminated via the illumination system, and the image of the mask is projected via the projection objective onto a substrate (for example a silicon wafer) which is coated with a light-sensitive layer (photoresist) and arranged in the image plane of the projection objective. This transfers the mask structure onto the light-sensitive coating on the substrate.

It is often desirable to produce light in the projection exposure apparatus that is as far as possible is unpolarized. For example, DE 198 29 612 A1 discloses depolarizing linearly polarized light from a laser source via a Hanle depolarizer and a light mixing system arranged downstream thereof.

In some instances, the light in the reticle plane of the illumination system can still have a residual polarization. Such residual polarization can be caused by anti-reflecting layers (AR layers) are present in the illumination system on the lenses, as well as the highly reflecting layers (HR layers) present on the mirrors.

It has been found that these effects can lead to non-homogenous distribution of the residual polarization. The non-homogenous distribution can be explained on the basis that a radial residual polarization distribution produced by the lenses (in particular the conical lenses of the axicon lens used in the illumination system) or by the AR layers on those lenses is superposed with a linear residual polarization of a constant preferred polarization direction, produced by the AR layers on the mirrors, wherein those mutually superposed residual polarization distributions increase or attenuate each other depending on the respective direction involved (for example perpendicular or parallel in relation to the scan direction).

US No 2005/0094268 A1 and WO 03/077011 A1 discloses breaking down an optical system into two subsystems with a retarder acting as a lambda/2 plate to be arranged therebetween. The retarder transposes two mutually perpendicular polarization states between the subsystems so that adding up the phase shifts in the second subsystem just cancels out that in the first subsystem. US No 2003/0086156 A1 discloses using a 90°-polarization rotator for example in a projection objective for mutual compensation of the retardations which are produced in a group which leads in relation to that 90°-polarization rotator and in a group which trails in relation to that 90°-polarization rotator.

SUMMARY

The disclosure provides an illumination system of a microlithographic projection exposure apparatus which permits the production of light without a preferred polarization direction in an image plane of the projection exposure apparatus in a simple and effective manner.

In some embodiments, an illumination system of a microlithographic projection exposure apparatus is configured so that, during use of the projection exposure apparatus, the illumination system illuminates an object plane of a projection objective of the projection exposure apparatus. Light components in point-symmetrical relationship with each other which are produced during use of the illumination system and which are only superposed in the object plane have mutually orthogonal polarization states.

In accordance with the present application, the expression "orthogonal polarization states" is used to mean those polarization states in which the scalar product of the Jones vectors which respectively describe the polarization states is zero. In that sense mutually orthogonal states are not just linear polarization states involving a mutually perpendicularly preferred polarization direction, but also circular polarization states of opposite handedness (that is to say left circular polarization and right circular polarization). In addition in accordance with the present application the expression linear polarization distributions is also used to mean polarization distributions, in respect of which the individual light beams are linearly polarized, wherein the oscillation planes of the electrical field strength vectors of the individual light beams (such as for example in the case of radial or tangential polarization distribution) can also be oriented in various directions.

The disclosure is based on the realization that unpolarized light can also be obtained by incoherent superpositioning of mutually orthogonal polarization states in point-symmetrical relationship with each other. Instead of the approach discussed in the opening part of this specification of mutual polarization-optical compensation of successive portions of the illumination system (for example by way of a 90° rotation of the preferred polarization direction, which occurs between such portions), it is thus possible in accordance with the present disclosure precisely to admit polarization effects to be added up in the illumination system. The distribution resulting from the corresponding residual polarization effects can then be specifically used for producing mutually orthogonal polarization states, from which the ultimately desired, effectively unpolarized light is then firstly obtained by incoherent superpositioning. The production of effectively unpolarized light as a consequence of superpositioning of orthogonal polarization states can in that respect be explained, on the basis of imaging theory, in that, with orthogonal entrance polarization states, the mixed term in the imaging equation which describes polarized imaging disappears so that that imaging equation transforms into the imaging equation for the case of unpolarized illumination.

Different regions involving mutually orthogonal polarization are provided shortly before the object plane of the projection objective (that is to say in particular still in a pupil plane of the illumination system itself), but no superpositioning of those mutually orthogonally polarized light components has occurred. In other words, in front of the reticle plane and in particular in the pupil plane of the illumination system, there is at least still a polarized component (for example a residual degree of polarization of at least 1 percent, at least 2 percent, at least 5%). In addition there can possibly even be at any illuminated location in the pupil plane light which is still completely polarized (or almost completely, for example to 95%). It is only the superpositioning of those light components in the reticle plane that leads to effectively unpolarized light.

The disclosure also provides an illumination system of a microlithographic projection exposure apparatus, where, during use of the microlithographic projection exposure apparatus, the illumination system illuminates an object plane of a projection objective of the projection exposure apparatus. The illumination system is configured so that light components which are produced during use of the illumination system and which are only superposed in the object plane have mutually orthogonal polarization states.

In accordance with an embodiment of the disclosure the light components having mutually orthogonal polarization states pass through respectively different regions of a pupil plane of the illumination system.

The fact that in accordance with the disclosure there are still mutually orthogonally polarized regions in front of the reticle plane and in front of the pupil plane respectively, which are only superposed in the reticle plane to afford unpolarized light, means that the concept according to the disclosure differs in particular from that of the Hanle depolarizer mentioned in the opening part of this specification, which already produces unpolarized light in the pupil plane of the illumination system by virtue of mixing of light components involving a different polarization state, which occurs in front of or in that pupil plane.

In accordance with an embodiment of the disclosure the regions in which the light components are produced with a mutually orthogonal polarization state are arranged in point-symmetrical relationship with each other in relation to the pupil center, that is to say in relation to a central position of the light beam cross-section in the pupil plane.

Production in accordance with the disclosure of orthogonal polarization states can be effected in a simple manner by a procedure whereby the distribution arising out of the above-mentioned residual polarization effects, at a suitable position in the illumination system (for example only just before the reticle plane) is divided up appropriately to obtain the desired orthogonal polarization states. An advantage of the approach according to the disclosure is thus also that the complication and expenditure involved in mutual polarization-optical compensation of successive portions of the illumination system (for example when selecting or suitably establishing the mutually compensating portions) is avoided.

In certain embodiments, it is possible for that purpose to use a polarization-influencing optical arrangement which, for a linearly polarized light component passing through that arrangement, leaves the polarization state unchanged over a first partial region of the light beam cross-section and over a second partial region of the light beam cross-section causes rotation of the preferred polarization direction through 90° or an odd-numbered multiple thereof.

The polarization-influencing optical arrangement can have for example at least one optical rotator element which in operation of the projection exposure apparatus covers only a fraction of the light beam cross-section and for linearly polarized light passing therethrough causes a rotation of the preferred polarization direction through 90° or through an odd-numbered multiple thereof.

In some embodiments, the polarization influencing optical arrangement can also be so designed that it converts a linearly polarized light component passing through the arrangement over a first partial region of the light beam cross-section into left-circularly polarized light and over a second partial region of the light beam cross-section into right-circularly polarized light. That can be implemented via an arrangement of lambda/4 plates with respectively appropriate orientation of the optical crystal axis, as is described in greater detail hereinafter.

In certain embodiments, the polarization-influencing optical arrangement can also be so designed that for a circularly polarized light component passing through the arrangement it leaves the polarization state unchanged over a first partial region of the light beam cross-section and over a second partial region of the light beam cross-section it reverses the handedness of the circularly polarized light. That can be achieved with a lambda/2 plate, as is described in greater detail hereinafter.

The last-described configurations, involving the production of circularly polarized light, have the advantage that, in those cases, the light components produced, with mutually orthogonal polarization states, namely the left-circularly polarized light on the one hand and the right-circularly polarized light on the other hand, behave in the same way in transmission through the illumination system or the projection objective as the different handedness is irrelevant to transmission.

In the case of the above-discussed production of mutually orthogonal polarization states in the form of linear polarization states with mutually perpendicular polarization directions in contrast the behavior involved is generally such that the transmission characteristics for those mutually orthogonal polarization states are different when passing through the optical system of the projection exposure apparatus. That difference in transmission behavior can be compensated by suitable implementation in respect of the energy distribution. Such compensations can be achieved for example by partial beams of a higher level of intensity, in comparison with the partial beam of minimal intensity, being attenuated in the intensity thereof (for example via a gray filter). One or more such gray filters can be combined in particular with polarization-optical elements like the polarization-influencing arrangement according to the disclosure and fitted at the same position in the optical system.

In some configurations, the polarization-influencing optical arrangement is arranged in an REMA objective which in operation of the projection exposure apparatus produces an image of an intermediate field plane in the object plane, such as in a pupil plane of the REMA objective. At such a position the residual polarization utilized in accordance with the disclosure is especially pronounced so that the production of the mutually orthogonal polarization states is also particularly efficiently possible.

The disclosure further provides a method of operating a microlithographic projection exposure apparatus having an illumination system and a projection objective. The illumination system illuminates an object plane of the projection objective, and, in the illumination system, light components in point-symmetrical relationship with each other with mutually orthogonal polarization states are produced in so that the light components are superposed only in the object plane.

The disclosure also provides a microlithographic projection exposure apparatus and a process for the microlithographic production of microstructured components as well as a microstructured component.

BRIEF DESCRIPTION OF THE DRAWINGS

Further configurations and embodiments are to be found in the description, claims and figures, in which:

FIGS. 3a-6b show diagrammatic views to illustrate the influence of a polarization-influencing optical arrangement used in accordance with the disclosure in an illumination system, on polarization distribution.

DETAILED DESCRIPTION

Figure 1:
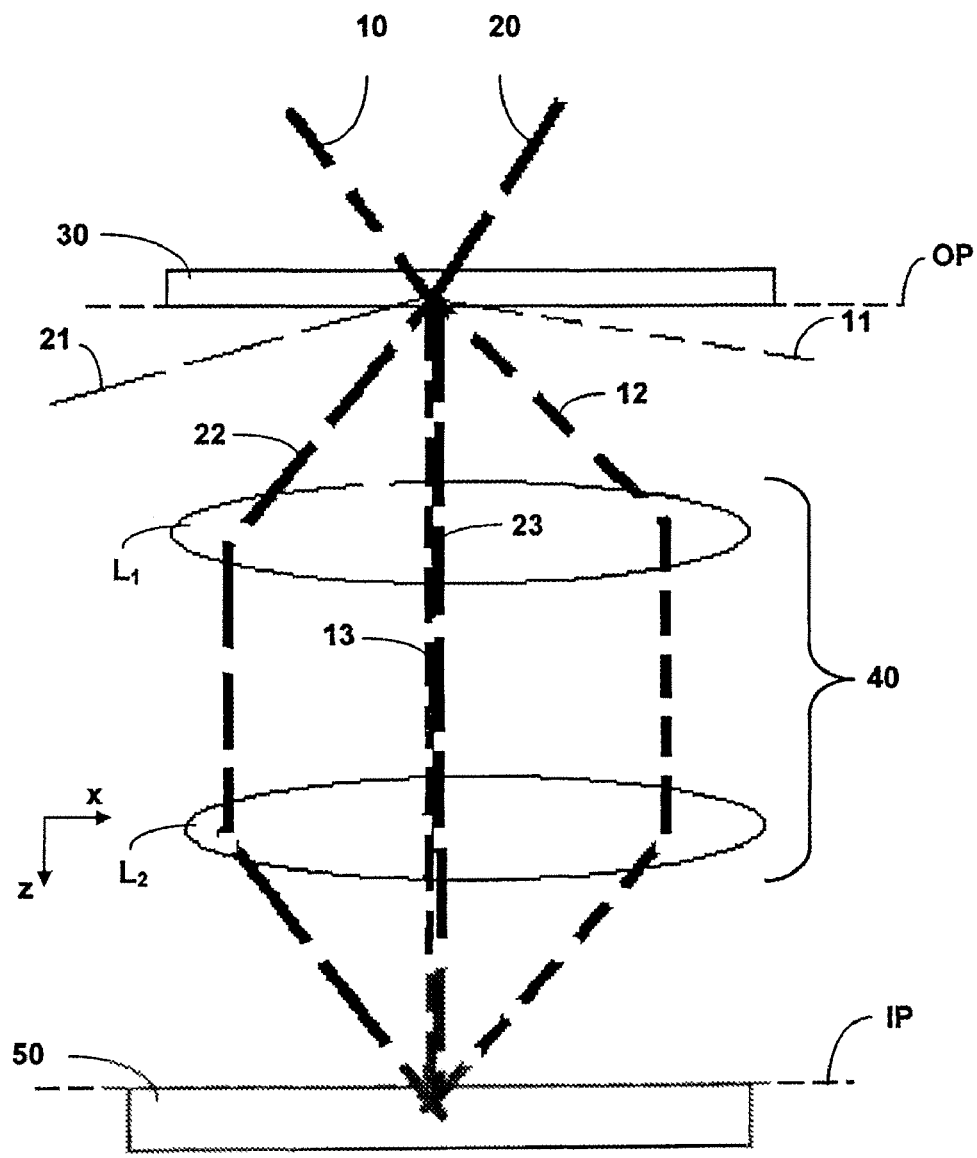
FIG. 1 shows a diagrammatic view to illustrate the basic principle used in the present disclosure for producing light without a preferred polarization direction in an image plane of a projection exposure apparatus.

Reference is made to FIG. 1 to describe the underlying principle of the disclosure, which is applied for producing light without a preferred polarization direction in an image plane of a projection exposure apparatus.

FIG. 1 is a greatly simplified diagrammatic view showing a reticle (or a mask) 30 having structures which are to be projected, the reticle being disposed in the object plane OP of a projection objective 40 (only symbolically indicated by two lenses $L_1$ and $L_2$). A substrate provided with a light-sensitive layer (or a wafer) 50 is disposed in the image plane IP of the projection objective 40.

FIG. 1 also shows two light beams 10 and 20 which, coming from an illumination system (not shown in FIG. 1), meet in the object plane OP of the projection objective 40, the light beams 10, 20 being diffracted at the structure on the reticle 30. In that respect it is assumed that the structure 30 includes (at least inter alia) a pattern comprising lines extending in the scan direction, wherein that scan direction extends parallel to the y-axis (oriented in perpendicular relationship to the plane of the paper) in the co-ordinate system shown in FIG. 1 so that the above-mentioned diffraction occurs at those lines of the structure in perpendicular relationship to the scan direction (or to the y-axis).

Of that diffraction, FIG. 1 indicates for each of the light beams 10, 20, three diffraction orders 11-13 and 21-23 respectively, of which a respective diffraction order (namely the diffraction order 11 and 21 respectively) does not pass through the projection objective 40 whereas the other two diffraction orders 12, 13 and 22, 23 respectively pass through the projection objective 40, meeting again on the wafer 50 arranged in the image plane IP.

Effectively unpolarized light (that is to say light without a preferred polarization direction) is produced on the wafer 50 arranged in the image plane IP of the projection objective 40 without for that purpose the two light beams 10 and 20 from the illumination system themselves being unpolarized. Rather, in accordance with the disclosure a suitable configuration of the illumination system provides that the light beams 10 and 20 have mutually orthogonal polarization states. As is described in greater detail hereinafter those orthogonal polarization states can involve both linear polarization states with mutually perpendicular preferred polarization directions and also circular polarization states involving mutually opposite handedness (that is to say left-circularly polarized light and right-circularly polarized light).

In that respect the disclosure makes use of the effect that the two diffraction orders 12, 13 of the first light beam 10, passing through the projection objective 40, on the one hand, and the two diffraction orders 22, 23 of the second light beam 20, passing through the projection objective 40, on the other hand, also meet on the wafer 50 in the image plane IP when producing the image of the structure whose image is to be formed, involving mutually orthogonal polarization states, and in that situation are mutually superposed effectively to afford unpolarized light.

Figure 2:
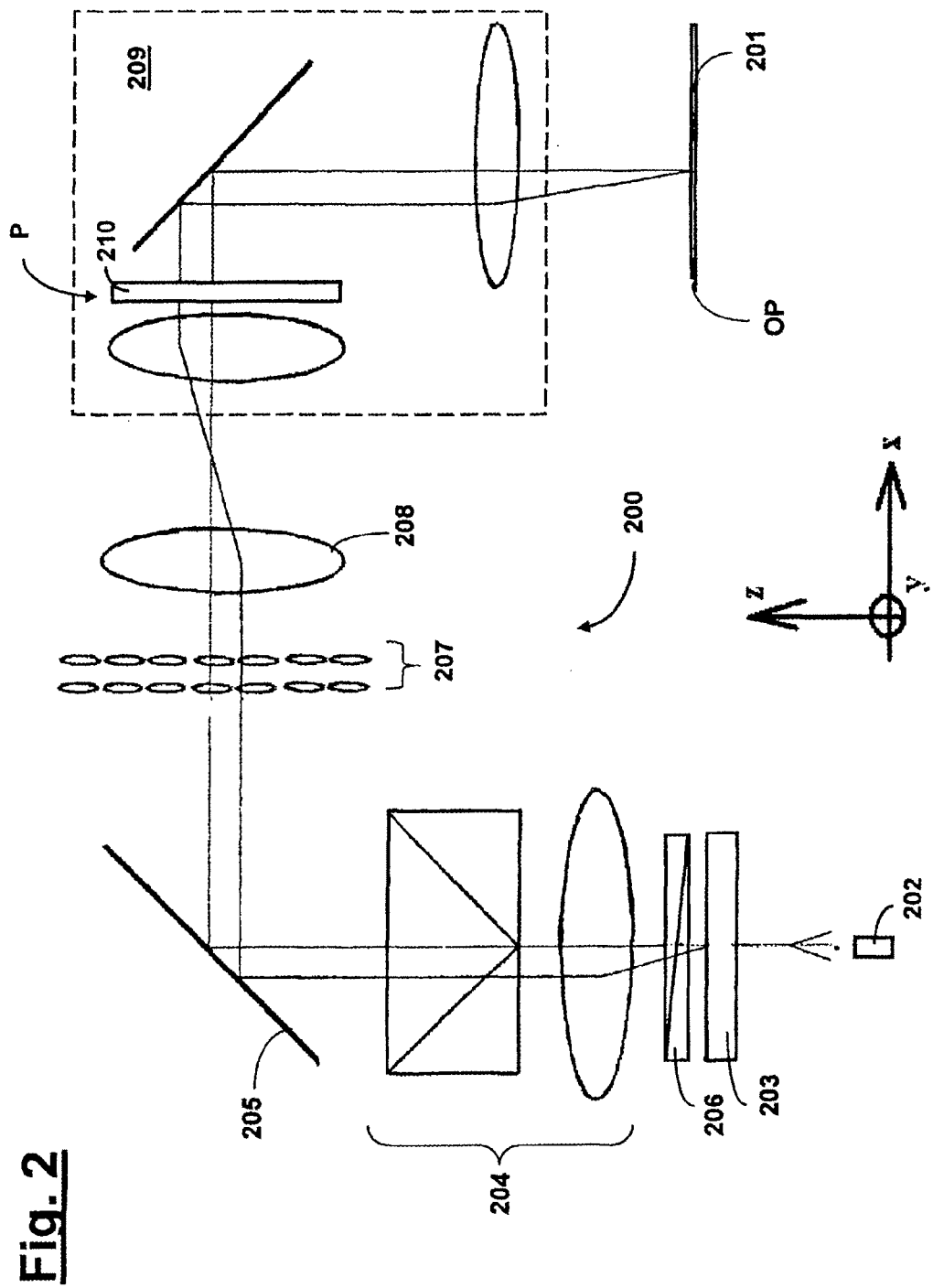
FIG. 2 shows a simplified diagrammatic view to illustrate the implementation of the present disclosure in an illumination system of a projection exposure apparatus.

FIG. 2 shows a diagrammatic view of an illumination system 200 of a microlithographic projection exposure apparatus. The illumination system 200 serves to illuminate a reticle (mask) 201 arranged in the object plane OP of a projection objective (not shown in FIG. 2), as was described hereinbefore with reference to FIG. 1.

Light impinges on the illumination system 200 from a light source unit 202 which for example can include an ArF laser for a working wavelength of 193 nm or an $F_2$ laser for a working wavelength of 157 nm with a beam-shaping optical mechanism for producing a parallel light beam. In the illustrated embodiment that parallel light beam firstly is incident on a diffractive optical element (DOE) 203 which in conjunction with a zoom axicon lens 204 arranged at a downstream position in the light propagation direction produces different illumination configurations in the pupil plane arranged downstream of a deflection mirror 205, depending on the respective zoom setting and position of the axicon elements. Disposed downstream of the DOE 203 in the beam path is a depolarizer 206 (for example a Hanle depolarizer) for converting the linearly polarized light of the light source 202 in conjunction with a downstream-disposed light mixing system 207 into unpolarized light. In the illustrated embodiment the light mixing system 207 is in the form of a per se known arrangement of microoptical elements. Alternatively however it is also possible to use a honeycomb condenser or bar integrator as the light mixing system in known fashion. An intermediate field plane arranged downstream of an optical imaging mechanism 208 following the light mixing system 207 is projected by an REMA objective 209 (only diagrammatically indicated) onto the reticle 201 carrying the structure, the image of which is to be produced. The structure-bearing reticle 201 is projected by a projection objective (not shown in FIG. 2) onto a light-sensitive substrate similarly to FIG. 1.

Disposed in the pupil plane identified by "P" within the REMA objective 209 is a polarization-influencing optical arrangement 210, in regard to the implementation of which different embodiments are described hereinafter with reference to FIGS. 3 through 6.

Figure 3:
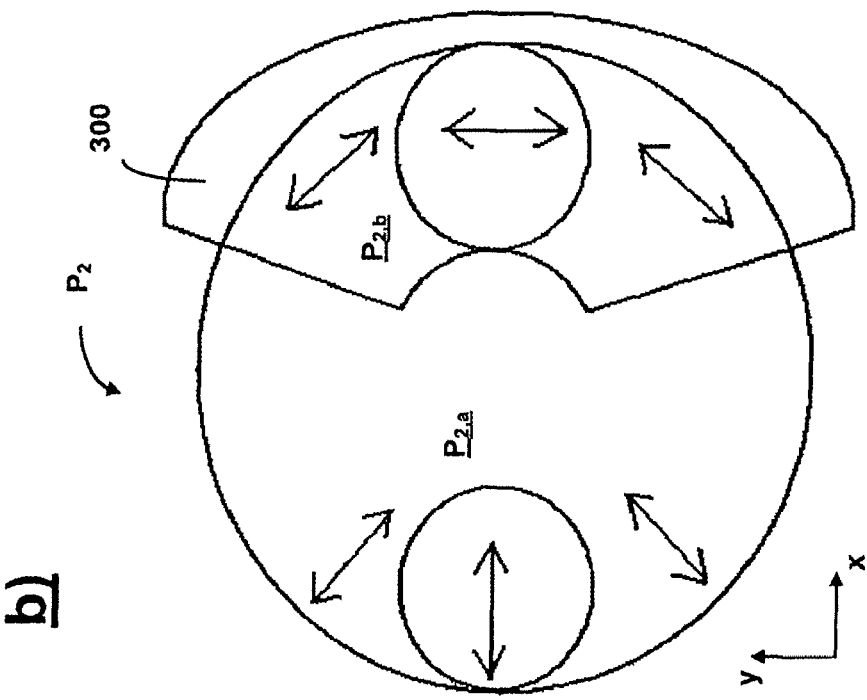
Figure 3:
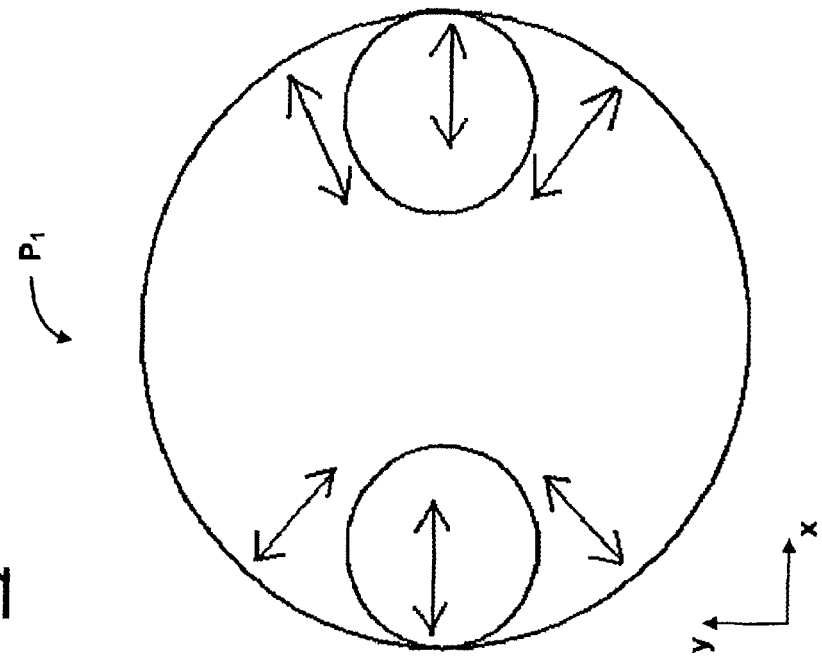
Figure 4:
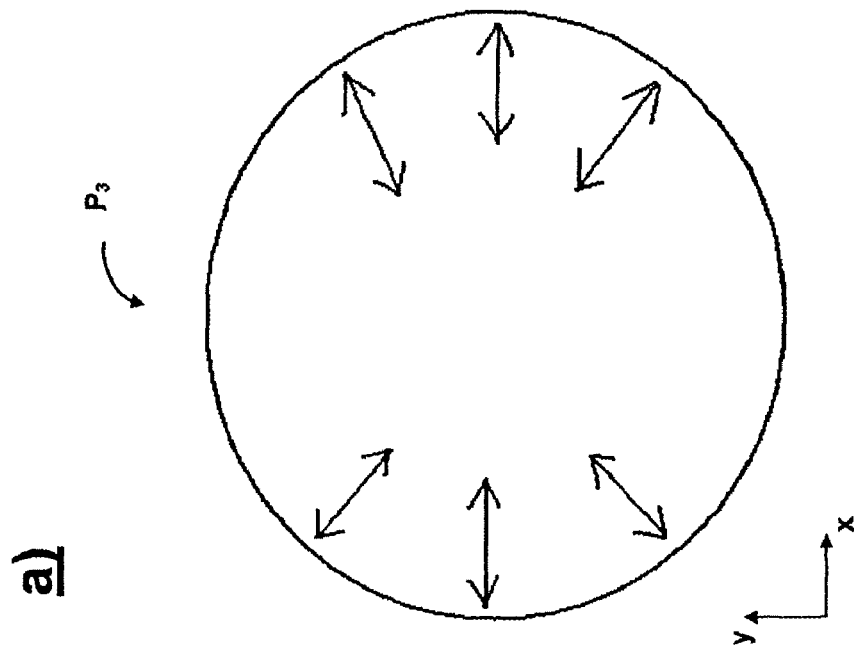
Figure 4:
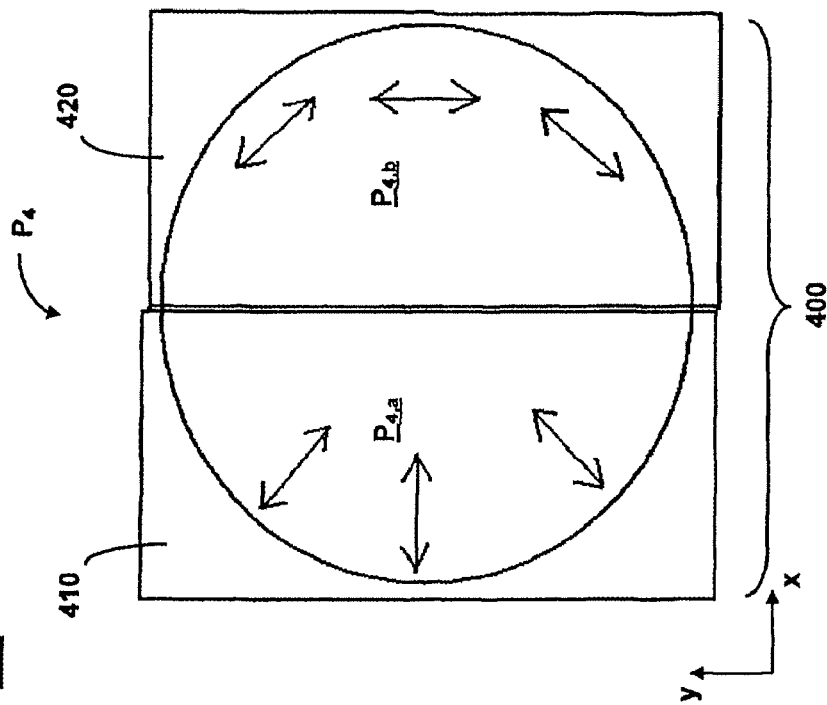
Figure 5:
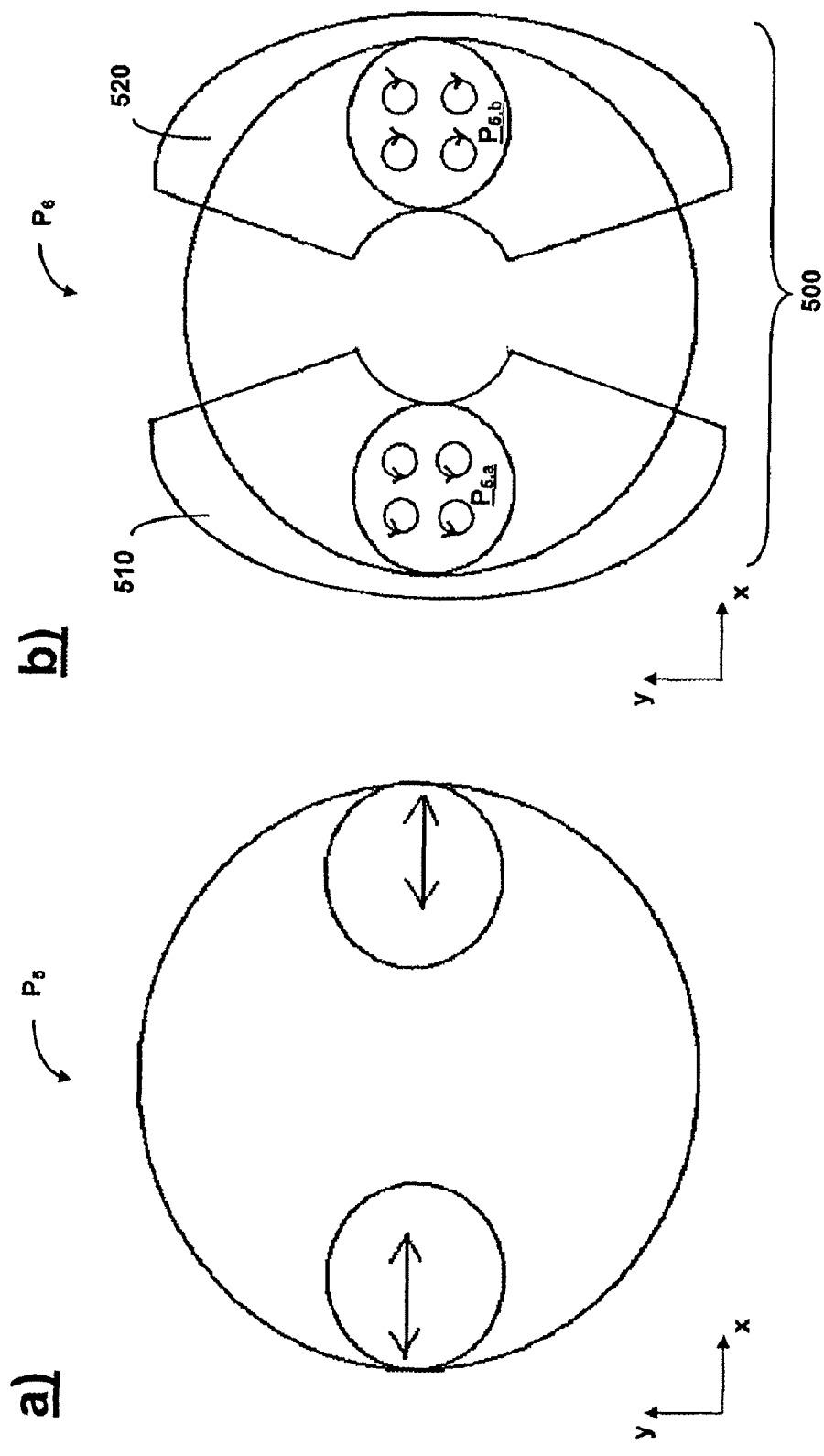
Figure 6:
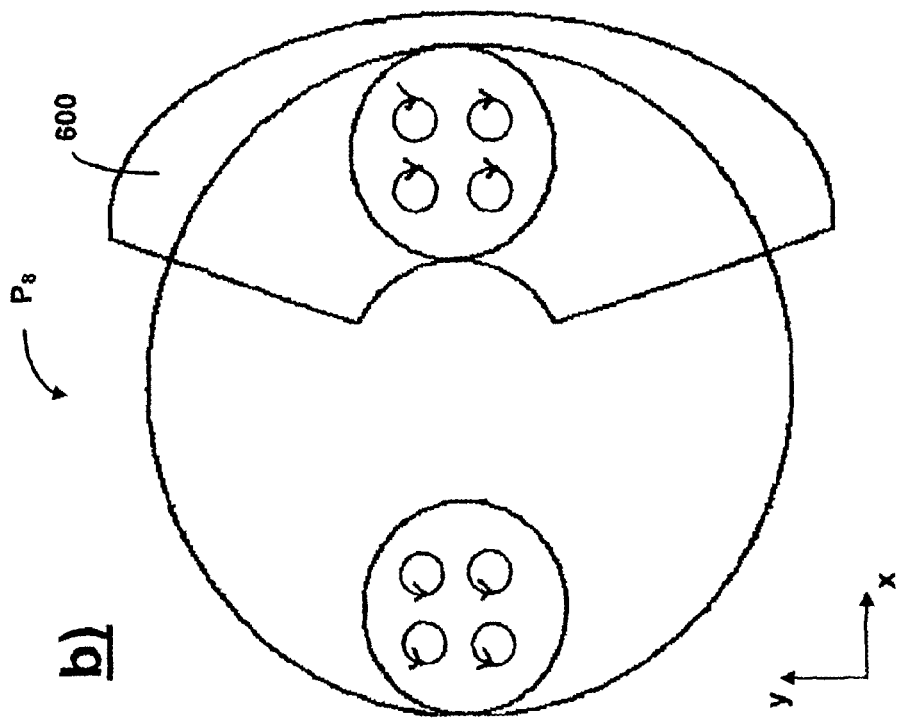
Figure 6:
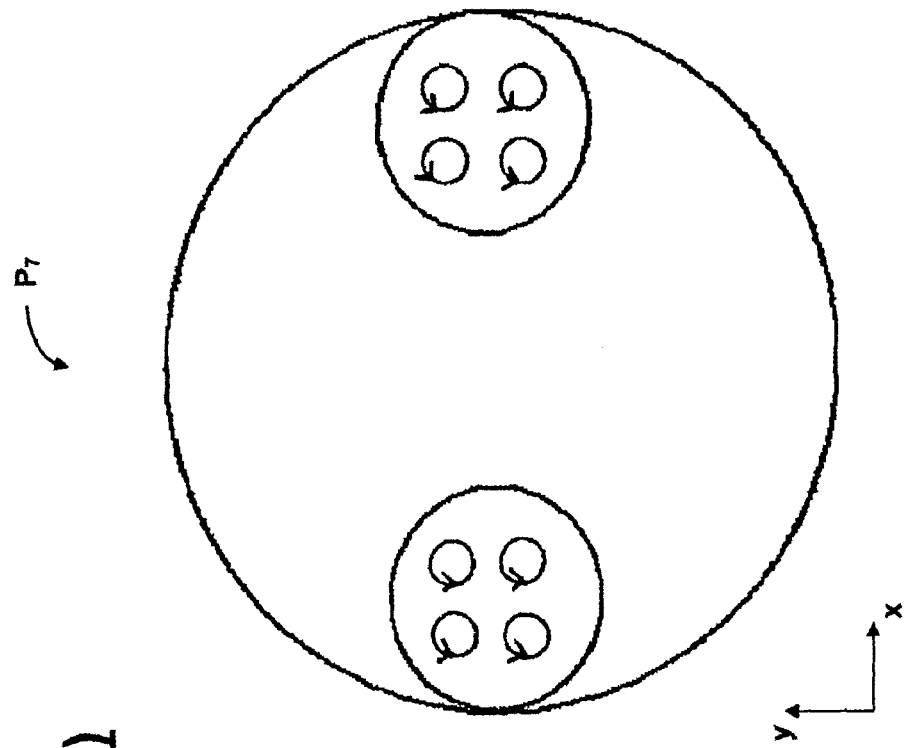

A common feature to the embodiments of a polarization-influencing optical arrangement as shown in FIGS. 3 through 5 is that that arrangement produces light components involving mutually orthogonal polarization states from the light which is incident on the arrangement and which involves a linear residual polarization, those light components being arranged symmetrically relative to a central position of the light beam cross-section in the pupil plane P.

In that respect the above-mentioned linear residual polarization of the light incident on the polarization-influencing optical arrangement results in particular from a non-homogenous residual polarization distribution arising out of superpositioning of the effects of HR layers and AR layers in the illumination system. As discussed in the opening part of this specification that residual polarization distribution is to be attributed to the fact that a radial residual polarization distribution produced by the AR layers on the lenses (in particular on the conical lenses of the zoom axicon 204) is superposed with a linear residual polarization which is produced by HR layers and which involves a constant preferred polarization direction, wherein those mutually superposed residual polarization distributions increase or attenuate each other depending on the direction involved (perpendicularly or parallel in relation to the scan direction).

Reference is made hereinafter to FIGS. 3a and 3b to describe a polarization-influencing optical arrangement 300 in accordance with a first embodiment of the disclosure.

FIG. 3a firstly diagrammatically shows an example of a polarization distribution $P_1$ which occurs in the pupil plane P of the REMA objective 209, wherein purely by way of example the basis adopted is what is referred to as a dipole-X-illumination setting in which light is limited in the pupil plane P to the poles of a dipole extending in the x-direction (that is to say perpendicularly to the scan direction which is in the y-direction). As indicated by the double-headed arrows in FIG. 3a which respectively symbolize the oscillation direction of the electrical field strength vector, an at least approximately radial residual polarization distribution occurs by virtue of the above-discussed residual polarization effects in the regions of those poles.

FIG. 3b now shows for that example the effect of a polarization-influencing optical arrangement 300 according to a first embodiment of the disclosure. In the illustrated embodiment the arrangement 300 comprises an optical rotator element which, for linearly polarized light passing therethrough, causes rotation of the preferred polarization direction through 90° or an odd-numbered multiple thereof. When using synthetic, optically active, crystalline quartz with a specific rotational capability α of about 323.1° per mm at a wavelength of 193 nm and at a temperature of 21.6° C., that condition corresponds to a thickness of that polarization-influencing optical element of 278.5 μm+N*557 μm (N=0, 1, 2, . . . ) or an odd-numbered multiple thereof. In that respect the arrangement 300 or the polarization-influencing optical element covers only a fraction of the light beam cross-section, more specifically substantially the region of one of the two poles of the above-mentioned dipole-X-illumination setting.

The double-headed arrows in FIG. 3b identify the polarization distribution arising as a consequence of the influence of the arrangement 300. As shown in FIG. 3b a tangential polarization distribution arises out the originally radial polarization distribution by the action of the arrangement 300 in the pole at the right in FIG. 3b, in respect of which tangential polarization distribution the oscillation direction of the electrical field strength vector has been rotated through 90° and is now oriented in perpendicular relationship to the radius directed onto the optical axis (extending in the z-direction).

In the embodiment shown in FIGS. 4a and 4b, a polarization-influencing optical arrangement 400 for conversion of the polarization distribution $P_3$ of FIG. 4a (which corresponds to the polarization distribution $P_1$ of FIG. 3), besides an optical rotator element 420 which covers half the light beam cross-section and is of a similar configuration to the polarization-influencing element in FIG. 3b, includes a compensating plate 410 which does not influence the polarization distribution and which comprises material which is not birefringent, that is to say neither linearly nor circularly birefringent, for example optically amorphous quartz glass. That compensating plate 410 serves for compensation of the optical paths and optical transmission in the two regions $P_{4,a}$ and $P_{4,b}$.

In the further embodiment diagrammatically shown in FIG. 5 a polarization-influencing optical arrangement 500 for conversion of the polarization distribution $P_5$ shown in FIG. 5a (which again corresponds to the polarization distributions of $P_1$ and $P_3$ in FIG. 3a and FIG. 4a respectively) includes two lambda/4 plates 510 and 520, the optical crystal axis in the first lambda/4 plate 510 being oriented at an angle of +45° relative to the x-axis and the optical crystal axis in the second lambda/4 plate 520 being oriented at an angle of −45° relative to the x-axis. The lambda/4 plates 510 and 520 can be made from any suitable birefringent material, for example for a working wavelength of 193 nm, from magnesium fluoride ($MgF_2$) or crystalline quartz ($SiO_2$).

As indicated in FIG. 5b the action of the arrangement 500 is that the linear polarization distribution $P_5$ in the region $P_{6,a}$ is converted into left-circularly polarized light whereas the linear entrance polarization distribution $P_5$ in the region $P_{6,b}$ is converted into right-circularly polarized light. As in the above-described embodiments therefore the polarization-influencing optical arrangement 500 also produces light components involving a mutually orthogonal polarization state from the light which is incident on the arrangement and which involves linear residual polarization, those light components being arranged symmetrically relative to a central position of the light beam cross-section.

FIG. 6a shows a polarization distribution $P_7$, and FIG. 6b shows a polarization-influencing optical arrangement 600 for converting the polarization distribution $P_7$ (a homogenous circular polarization distribution, in the illustrated example being left-circularly polarized light). Arrangement 600 is a lambda/2 plate which can be made from any suitable birefringent material, for example for a working wavelength of 193 nm from magnesium fluoride ($MgF_2$) or crystalline quartz ($SiO_2$). In this case, similarly to the FIG. 3b embodiment, the arrangement 600 or the lambda/2 plate covers only a fraction of the light beam cross-section, more specifically once again substantially the region of one of the two poles of the above-mentioned dipole-X-illumination setting. As the lambda/2 plate reverses the handedness of the circularly polarized light passing through it, it produces right-circularly polarized light in the region of the right pole of the dipole-X-distribution. In the case of the use, which is also possible, of right-circularly polarized light incident on the arrangement 600, the lambda/2 plate produces left-circularly polarized light, similarly to that in the region of the light beam cross-section that is covered by it.

Accordingly therefore the polarization-influencing optical arrangement 600 once again produces the desired light components, involving a mutually orthogonal polarization state, from the light which is incident on the arrangement 600 and which is of a circular polarization distribution, wherein those light components are again arranged symmetrically relative to a central position of the light beam cross-section.

It will be appreciated that, in the embodiments described hereinbefore with reference to FIGS. 3a through 6b, the respective polarization-influencing optical elements can also be composed from two or more plate portions, and that can be advantageous in regard to the limited availability of the respective crystalline material used. Furthermore it will be appreciated that compensating plates can also be provided in all embodiments, similarly to the embodiment of FIG. 4.

FIG. 7 shows once again in simplified form the structure of an illumination system 700 in accordance with a further embodiment of the present disclosure. In this case, in comparison with FIG. 2, corresponding elements or elements of substantially the same function are denoted by corresponding references increased by 500.

Figure 7:
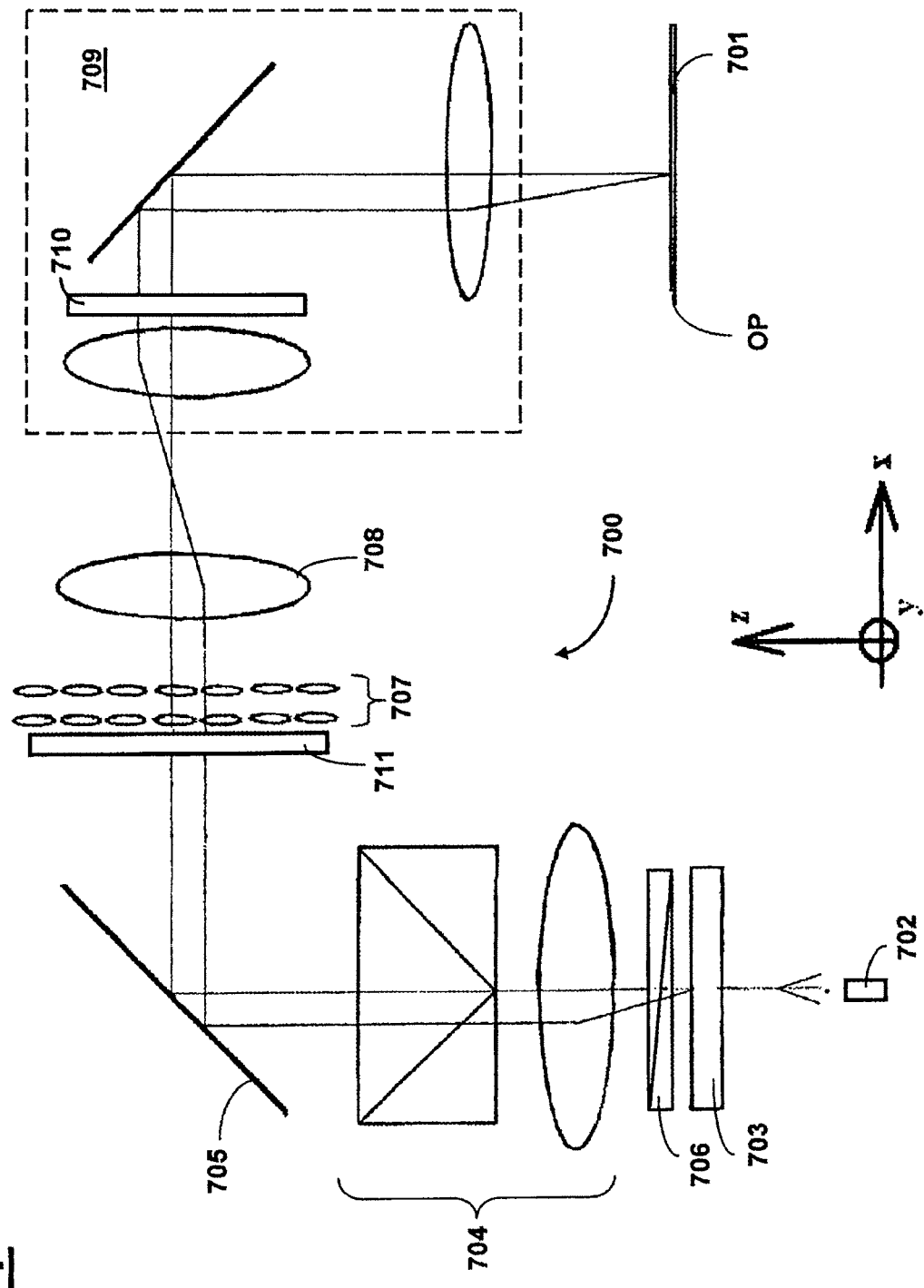
FIG. 7 shows a simplified diagrammatic view of an illumination system according to a further embodiment of the present disclosure.

The illumination system 700 of FIG. 7 differs from that in FIG. 2 by an additional optical rotator element 711 which is arranged in the pupil plane downstream of the zoom axicon 704 and which produces rotation of the preferred polarization direction through 90° over the entire light beam cross-section for linearly polarized light passing therethrough. When using synthetic, optically active, crystalline quartz that condition thus again corresponds to a thickness of about 278.5 µm+N*557 µm (N=0, 1, 2, ...). It is possible via the optical 90° rotator, in basically known fashion, to provide for effective interchange of the mutually perpendicular polarization states between the subsystems arranged upstream and downstream of that rotator element 711 respectively and thus at least partial nullification of the phase shifts accumulated in the subsystems.

That compensation principle is combined in the FIG. 7 embodiment with the production, that is characteristic of the present disclosure, of orthogonal polarization states from a residual polarization remaining in the pupil plane of the REMA objective 709.

Even if the disclosure has been described by reference to specific embodiments numerous variations and alternative embodiments will be apparent to the man skilled in the art, for example by combination and/or exchange of features of individual embodiments. Accordingly it will be appreciated by the man skilled in the art that such variations and alternative embodiments are also embraced by the present disclosure and the scope of the disclosure is limited only in the sense of the accompanying claims and equivalents thereof.

What is claimed is:

1. An illumination system configured to be used a microlithographic projection exposure apparatus, wherein:
   the illumination system is configured so that, during operation of the microlithographic projection exposure apparatus, the illumination system illuminates an object plane of a projection objective of the projection exposure apparatus;
   the illumination system is configured so that light components in point-symmetrical relationship with each other, which are produced during operation of the illumination system, and which are superposed only in the object plane of the projection objective, have mutually orthogonal polarization states;
   the light components having mutually orthogonal polarization states pass through respectively different regions of a pupil plane of the illumination system; and
   the regions are arranged in point-symmetrical relationship with each other in relation to a central position of the light beam cross-section in the pupil plane of the illumination system.

2. An illumination system as set forth in claim 1, wherein, during operation of the microlithographic projection exposure apparatus, light components upon diffraction at a structure in the object plane of the projection objective are mutually superposed in an image plane of the projection objective to provide effectively unpolarized light.

3. An illumination system as set forth in claim 1, comprising a polarization-influencing optical arrangement configured to produce the light components with mutually orthogonal polarization states.

4. An illumination system as set forth in claim 3, wherein, for a linearly polarized light component passing through the polarization-influencing optical arrangement, the polarization-influencing optical arrangement: 1) leaves the polarization state unchanged over a first partial region of a light beam cross-section; and 2) over a second partial region of the light beam cross-section causes a rotation of a preferred polarization direction through 90° or an odd-numbered multiple thereof.

5. An illumination system as set forth in claim 3, wherein the polarization-influencing optical arrangement comprises at least one optical rotator element configured so that, during operation of the microlithographic projection exposure apparatus, the at least one optical rotator element: 1) covers only a fraction of a light beam cross-section; and 2) causes a rotation of a preferred polarization direction through 90° or through an odd-numbered multiple thereof for linearly polarized light passing through the at least one optical rotator element.

6. An illumination system as set forth in claim 3, wherein the polarization-influencing optical arrangement is configured to convert a linearly polarized light component passing through the arrangement over a first partial region of the light beam cross-section into left-circularly polarized light and over a second partial region of the light beam cross-section into right-circularly polarized light.

7. An illumination system as set forth in claim 3, wherein the polarization-influencing optical arrangement is configured so that, for a circularly polarized light component passing through the polarization-influencing optical arrangement, the polarization-influencing optical arrangement: 1) leaves the polarization state unchanged over a first partial region of a light beam cross-section; and 2) reverses the handedness of the circularly polarized light over a second partial region of the light beam cross-section.

8. An illumination system as set forth in claim 3, wherein the polarization-influencing optical arrangement is arranged in an REMA objective which, during operation of the projection exposure apparatus, is configured to produce an image of an intermediate field plane in the object plane.

9. An illumination system as set forth in claim 8, wherein the polarization-influencing optical arrangement is arranged in an REMA objective which, during operation of the projection exposure apparatus, is configured to produce an image of an intermediate field plane in a pupil plane of the REMA objective.

10. An illumination system as set forth in claim 1, wherein the mutually orthogonal polarization states are linear polarization states with mutually perpendicular preferred polarization directions.

11. An illumination system as set forth in claim 1, wherein the mutually orthogonal polarization states are circular polarization states with mutually opposite handedness.

12. A microlithographic projection exposure apparatus, comprising:
   an illumination system having a pupil plane; and
   a projection objective having an object plane,
   wherein:
      during operation of the microlithographic projection exposure apparatus, the illumination system illuminates the object plane of the projection objective;
      the illumination system is configured so that light components in point-symmetrical relationship with each other, which are produced during operation of the illumination system, and which are superposed only in the object plane of the projection objective, have mutually orthogonal polarization states;
      the light components having mutually orthogonal polarization states pass through respectively different regions of the pupil plane of the illumination system; and
      the regions are arranged in point-symmetrical relationship with each other in relation to a central position of a light beam cross-section in the pupil plane of the illumination system; and
      the apparatus is a microlithographic projection exposure apparatus.

13. An apparatus as set forth in claim 12, wherein, during operation of the microlithographic projection exposure apparatus, light components upon diffraction at a structure in the object plane of the projection objective are mutually superposed in an image plane of the projection objective to provide effectively unpolarized light.

14. An apparatus as set forth in claim 12, wherein the illumination system comprises a polarization-influencing optical arrangement configured to produce the light components with mutually orthogonal polarization states.

15. An apparatus as set forth in claim 12, wherein the mutually orthogonal polarization states are linear polarization states with mutually perpendicular preferred polarization directions.

16. An apparatus as set forth in claim 12, wherein the mutually orthogonal polarization states are circular polarization states with mutually opposite handedness.

17. A process, comprising using a microlithographic projection exposure apparatus as set forth in claim 12 to project at least a part of a mask onto a region of a light-sensitive material supported by a substrate.

18. A method, comprising:
   operating a microlithographic projection exposure apparatus comprising an illumination system and a projection objective,
   wherein:
      the illumination system illuminates an object plane of the projection objective;
      in the illumination system light components in point-symmetrical relationship with each other with mutually orthogonal polarization states are produced in such a way that said light components are superposed only in the object plane of the projection objective;
      the light components having mutually orthogonal polarization states pass through respectively different regions of a pupil plane of the illumination system;
      the regions are arranged in point-symmetrical relationship with each other in relation to a central position of the light beam cross-section in the pupil plane.

19. A method as set forth in claim 18, wherein the light components are superposed upon diffraction at a structure in the object plane in an image plane of the projection objective to afford effectively unpolarized light.

20. The process of claim 18, wherein the process produces a microstructured component.

* * * * *

UNITED STATES PATENT AND TRADEMARK OFFICE
CERTIFICATE OF CORRECTION

PATENT NO. : 8,319,945 B2
APPLICATION NO. : 12/779133
DATED : November 27, 2012
INVENTOR(S) : Damian Fiolka Page 1 of 1

It is certified that error appears in the above-identified patent and that said Letters Patent is hereby corrected as shown below:

Column 2,
Line 57, delete "that that" and insert --that the--

Column 6,
Line 52, delete "that that" and insert --that the--

Column 7,
Line 19, delete "an" and insert --and--

Signed and Sealed this
Twenty-sixth Day of February, 2013

Teresa Stanek Rea
*Acting Director of the United States Patent and Trademark Office*